(12) United States Patent
Yamada et al.

(10) Patent No.: US 8,137,050 B2
(45) Date of Patent: Mar. 20, 2012

(54) PICKUP DEVICE AND PICKUP METHOD

(75) Inventors: Daiki Yamada, Kanagawa (JP); Naoto Kusumoto, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 913 days.

(21) Appl. No.: 11/524,071

(22) Filed: Sep. 20, 2006

(65) Prior Publication Data
US 2007/0069340 A1 Mar. 29, 2007

(30) Foreign Application Priority Data
Sep. 29, 2005 (JP) .................................. 2005-284550

(51) Int. Cl.
*H01L 29/40* (2006.01)
(52) U.S. Cl. ................... 414/806; 414/416.05
(58) Field of Classification Search .................. 414/403, 414/416.01, 416.05, 416.1
See application file for complete search history.

(56) References Cited

U.S. PATENT DOCUMENTS

| | | | |
|---|---|---|---|
| 4,472,218 A * | 9/1984 | Avedissian et al. ............. | 156/64 |
| 4,859,269 A | 8/1989 | Nishiguchi | |
| 6,074,934 A * | 6/2000 | Dautartas et al. ............. | 438/462 |
| 6,123,800 A * | 9/2000 | Freund et al. ................. | 156/344 |
| 6,290,805 B1 * | 9/2001 | Freund et al. ................. | 156/344 |
| 6,561,743 B1 | 5/2003 | Nakatsu | |
| 6,889,427 B2 * | 5/2005 | Yee et al. ......................... | 29/832 |
| 7,465,142 B2 * | 12/2008 | Yoo ........................... | 414/416.09 |
| 2002/0019074 A1 | 2/2002 | Nakazawa et al. | |
| 2004/0091342 A1 * | 5/2004 | Yajima et al. ............ | 414/416.01 |
| 2004/0115904 A1 | 6/2004 | Cheung et al. | |

FOREIGN PATENT DOCUMENTS

| | | |
|---|---|---|
| CN | 1431692 | 7/2003 |
| CN | 1431692 A | 7/2003 |
| EP | 1321966 A | 6/2003 |
| JP | 5-3242 | 1/1993 |
| JP | 2001-118862 | 4/2001 |
| JP | 2003-224088 | 8/2003 |
| JP | 2004-241685 A | 8/2004 |

OTHER PUBLICATIONS

Chinese Office Action for Application No. 200610141623.6, dated Jul. 17, 2009.

* cited by examiner

*Primary Examiner* — Charles A Fox
(74) *Attorney, Agent, or Firm* — Husch Blackwell LLP

(57) ABSTRACT

It is an object of the present invention to provide a device which can pick up a chip from an adhesive film while preventing damage to the chip. In addition, a device which can pick up a chip over an adhesive film with a high yield is provided. A pickup device includes: a frame for holding a film to which a chip is attached, which is fixed to a support; a pressing jig which presses a surface of the film, to which a chip is not attached, while rotated or moved; a holding jig which holds the chip simultaneously with or after the pressing jig pressing the film; and a moving unit which moves the holding jig.

35 Claims, 9 Drawing Sheets

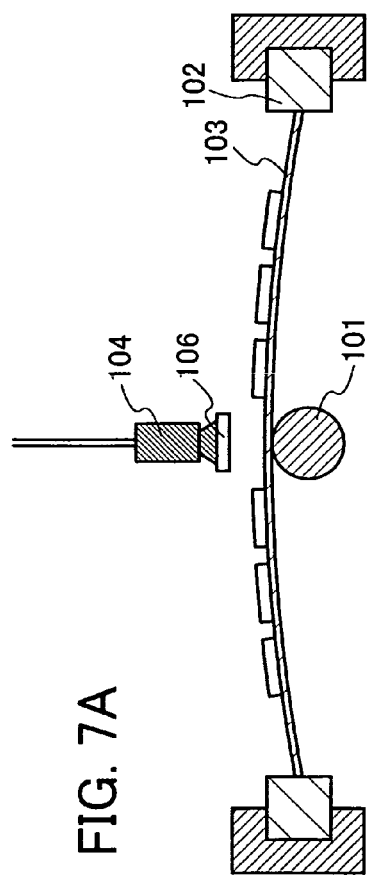
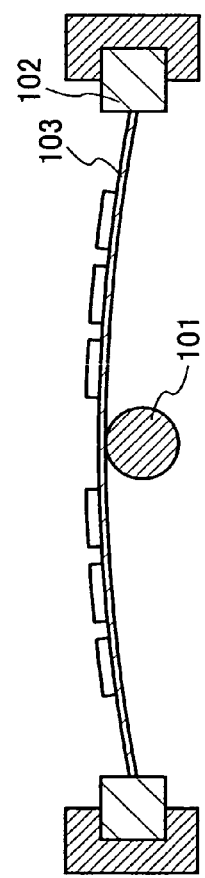
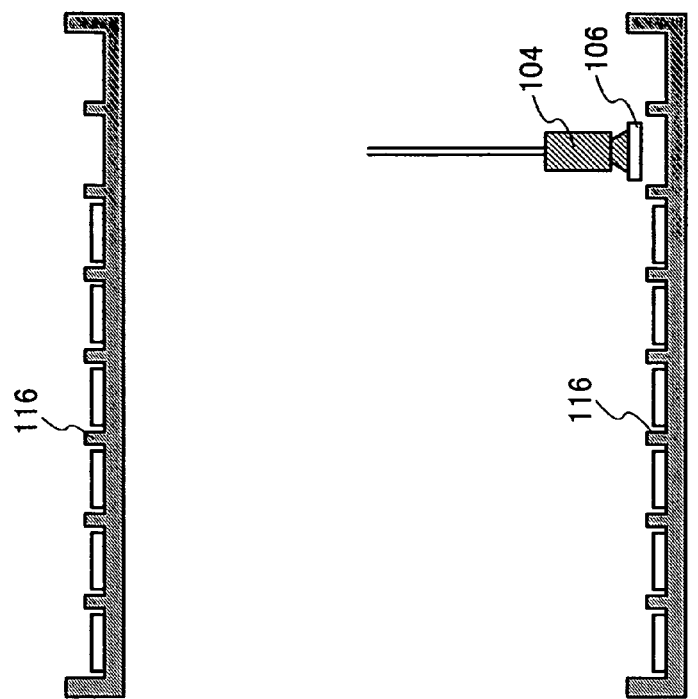

PICKUP DEVICE AND PICKUP METHOD

BACKGROUND OF THE INVENTION

1. Field of the Invention

The present invention relates to a pickup device which separates a piece attached to a film from the film. Also, the present invention relates to a pickup method for separating a piece attached to a film from the film.

2. Description of the Related Art

In recent years, downsized electronic devices and portable electronic devices have become mainstream, and along with that, demand for smaller and thinner semiconductor devices has been increasing. In addition, development of a semiconductor device which has an integrated circuit formed of thin film transistors over plastic has been advanced.

An IC chip used for a semiconductor device and an integrated circuit formed of a thin film transistor are formed by cutting a silicon wafer and a plastic substrate attached to an adhesive film into a lattice pattern in a dicing process.

Conventionally, a piece (an IC chip, pellet, or the like, which hereinafter will be also referred to as a chip) which is diced over an adhesive film is pushed up from a back side (bottom) of the film using a push-up pin, and the chip rising from the adhesive film is picked up by a collet, then placed on a tray or mounted on a printed-circuit board (for example, see Patent Document 1: Japanese Patent Laid-Open No. H5-3242).

However, when a chip is raised from an adhesive film by using a pointed pin as described in Patent Document 1, there is a problem that the chip is damaged. Typically, in a case of an IC chip diced from a wafer, there is a problem such as a crack or flaw of a chip, or the like. In addition, in a case of a film-like chip, there is a problem such as a tear of a chip, or the like.

SUMMARY OF THE INVENTION

In view of the foregoing problem, it is an object of the present invention to provide a device which can pick up a chip while preventing damage of the chip over an adhesive film. Furthermore, the present invention provides a device which can pick up a chip over an adhesive film with a high yield.

One feature of the present invention is a pickup device including: a frame which is fixed to a support and holds a film to which a chip is attached; a pressing jig which presses a surface of the film, to which a chip is not attached, while moving relative to the frame in a direction parallel to a surface of the film, to which the chip is attached; a holding jig which holds the chip attached to a portion of the film being pressed or having been pressed by the pressing jig; and a moving unit which moves the holding jig.

Another feature of the present invention is a pickup device including: a frame which fixes a film to which a chip is attached; a support which holds the frame; a pressing jig which presses a surface of the film, to which a chip is not attached, while moving relative to the frame in a direction parallel to a surface of the film, to which the chip is attached; a holding jig which holds the chip attached to a portion of the film being pressed or having been pressed by the pressing jig; and a moving unit which moves the holding jig.

The support and/or the pressing jig is connected to a moving unit, so that part of the chip over a film can be separated from the film by pressing the pressing jig against the film while moving either the film held by the support, the pressing jig, or both, relative to one another. At this time, the pressing jig presses the film so that the film is bent. In addition, it is preferable that the pressing jig press the film so that at least two sides of the chip are separated from the film.

The pressing jig is preferably a rotation body such as a cylinder, a polygonal cylinder, or a sphere. In this case, by pressing the rotation body against the film while rotating the rotation body, part of the chip can be separated from the film. Alternatively, the rotation body can be moved without being rotated, while its rotation surface is pressed against the film.

Alternatively, the pressing jig is preferably a movable body such as a rectangular solid. In this case, by pressing an edge or surface of the rectangular solid against the film while moving the rectangular solid, part of the chip can be separated from the film.

A surface of the pressing jig is preferably uneven. For typical examples, the surface is grooved, ridged, embossed, or has a projection.

As the film to which the chip is attached, a film, sheet, or tape having an adhesive layer on one side can be used. The film does not necessarily have an adhesive layer, and in this case, the chip is attached to the surface of the film by static electricity or adsorption power.

As the holding jig which holds the chip part of which is separated from the film pressed by the pressing jig, a gripper such as a pair of tweezers or a pawl, a collet, a nozzle which can adsorb (hereinafter also referred to as a suction nozzle) or the like can be given. (Alternatively, the nozzle may also be referred to as an adsorption nozzle.) In addition, a tip of the suction nozzle is preferably formed of an elastic body. In addition, the suction nozzle is preferably connected to a decompression device.

The pickup device may be provided with one or more of an image recognition unit and a transport means. The transport means transports a tray on which the chip is placed, a wiring board, or the like.

Another feature of the present invention is a pickup method in which either a film to which a chip is attached and which is held by a frame, a pressing jig, or both are moved relative to one another in a horizontal direction to press the film, and the chip is picked up from the film.

Another feature of the present invention is a pickup method in which either a film to which a chip is attached and which is held by a frame, a pressing jig, or both are moved relative to one another in a horizontal direction, while the pressing jig is rotated, to press the film, and the chip is picked up from the film.

Either a film to which a chip is attached and which is held by a frame, a pressing jig, or both are moved relative to one another in a horizontal direction to press and bend the film, and spaces are formed between the chip and the film, then the chip is picked up. In addition, the horizontal direction is a direction parallel to a surface of the film, to which the chip is attached.

By pressing up or pressing down the film to which the chip is attached using the pressing jig, at least two sides of the chip are separated from the film, and an adhesive area between the chip and the film decreases; whereby adhesive or cohesive strength decreases. Therefore, when the chip part of which is separated from the film is held by a holding jig, the chip can be separated from the film easily.

As for the pickup device of the present invention, a member which separates a chip from a film is not sharply pointed, so that the chip can be picked up from the film without being damaged. In addition, since the film to which the chip is attached is pressed by the rotation surface, edge, or surface of the pressing jig while the pressing jig is moved or rotated, the chip can be separated from the film without being damaged, and with a high yield. Furthermore, the chip which is picked up from the film can be placed on a tray easily. Furthermore, the chip can be mounted on a printed-circuit board after aligning a terminal formed over the printed-circuit board and a terminal of the chip, which can enhance throughput.

BRIEF DESCRIPTION OF THE DRAWINGS

FIGS. 7A and 7B are views each showing a pickup method of the present invention.

DETAILED DESCRIPTION OF THE INVENTION

Figure 1A:
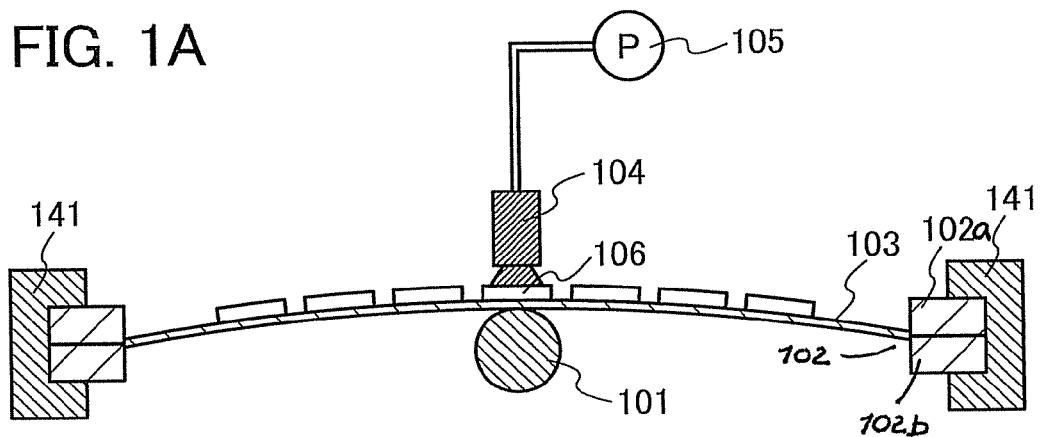
FIGS. 1A to 1C are cross-sectional views each showing a pickup device of the present invention.

Embodiment modes of the present invention will be described hereinafter with reference to the drawings. However, the present invention can be carried out in various modes, and it is easily understood by those skilled in the art that modes and details can be changed in various ways without departing from the spirit and scope of the invention. Therefore, the invention is not interpreted as being limited to the following description of the embodiment modes. It is to be noted that identical portions or portions having the same functions in all figures for explaining the embodiment modes are denoted by the same reference numerals, and repeated descriptions thereof are omitted.

Embodiment Mode 1

In this embodiment mode, a pickup device including a jig for pressing a film to which a chip is attached (hereinafter referred to as a pressing jig), a jig for holding a chip which is pressed (hereinafter referred to as a holding jig), and a support for holding a frame to which the film is fixed will be described.

Figure 1B:
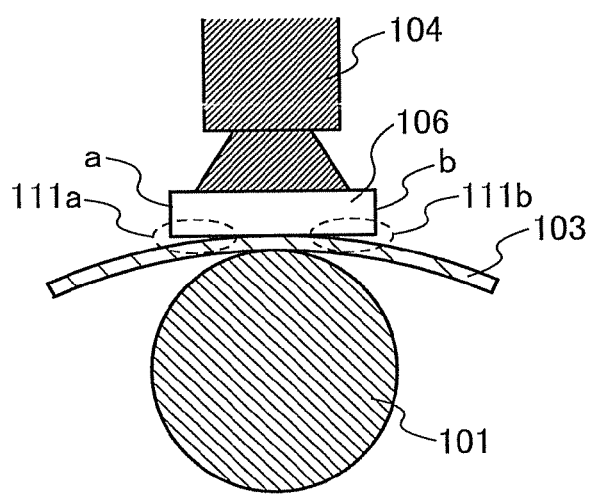
Figure 1C:
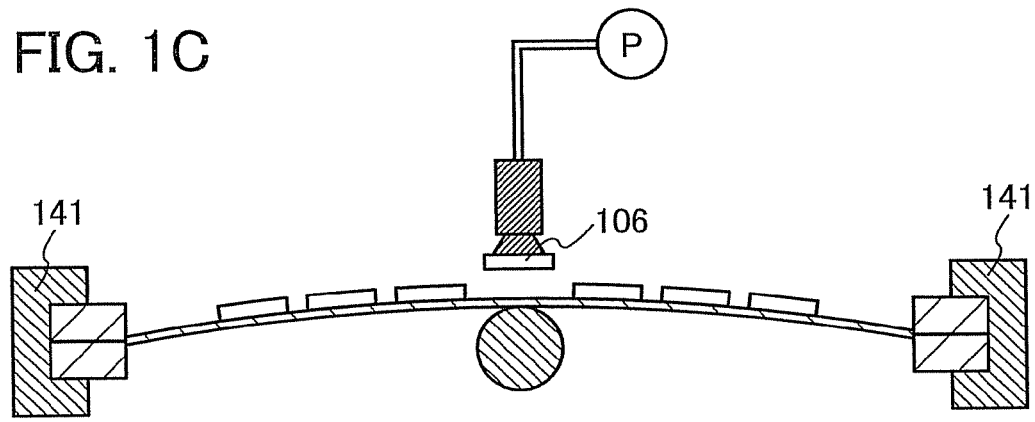

FIGS. 1A to 1C are cross-sectional views of a main portion of the pickup device of the present invention, showing a frame 102 held by a support 141, a film 103 fixed to the frame, a chip 106 attached to the film 103, a pressing jig 101 for pressing the film 103 to which the chip 106 is attached, and a holding jig 104 for holding the chip which is pressed. In this embodiment mode, an example in which the pressing jig 101 presses up the film 103 will be described.

Here, the pressing jig 101 for pressing up the film 103 will be described with reference to FIGS. 2A to 2F, FIG. 3, and FIGS. 4A and 4B.

FIGS. 2A to 2F are perspective views each showing an example of the pressing jig 101. The pressing jig 101 is a jig which presses the film 103 to which the chip 106 is attached while rotating or moving. A jig which can separate part of the chip 106, at least two sides of the chip 106 in a case of a rectangular chip, by the pressing is used as the pressing jig 101. Typically, the pressing jig 101 is preferably a rotation body or a movable body. As the rotation body, a cylinder 101a shown in FIG. 2A, a polygonal cylinder 101b shown in FIG. 2B, a sphere 101c shown in FIG. 2C, and the like can be given. In addition, as the movable body, a rectangular solid 101d shown in FIG. 2D can be used. It is to be noted that edges of the polygonal cylinder or the rectangular solid may have rounded and curved surfaces.

Figure 2A:
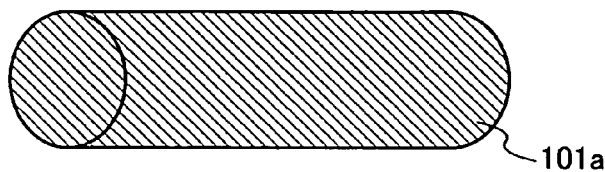
FIGS. 2A to 2F are perspective views each showing part of a pickup device of the present invention.
Figure 2B:
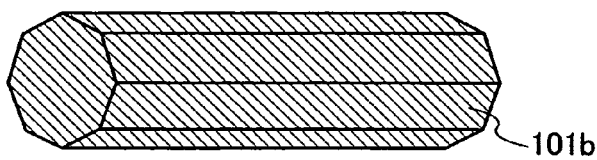
Figure 2C:
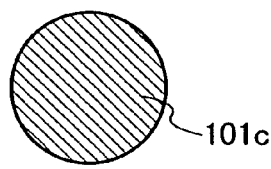
Figure 2D:
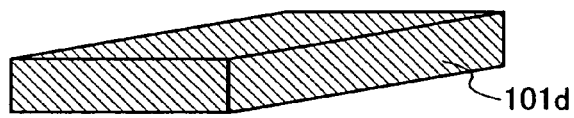
Figure 2E:
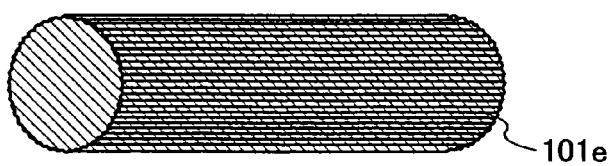
Figure 2F:
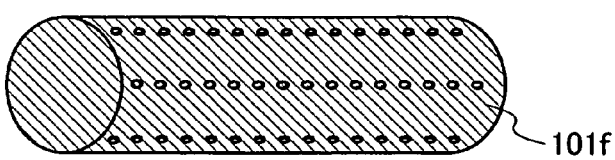

In addition, it is preferable that a surface of the pressing jig 101 which presses the film 103 be uneven. As typical examples of the uneven surface, a grooved surface, a surface with a projection, a ridged surface, an embossed surface and the like can be given. As typical examples of a pressing jig 101 having such an uneven surface, a rotation body or a movable body with grooves 101e as shown in FIG. 2E, and a rotation body or a movable body with projection portions 101f as shown in FIG. 2F can be given.

Figure 3:
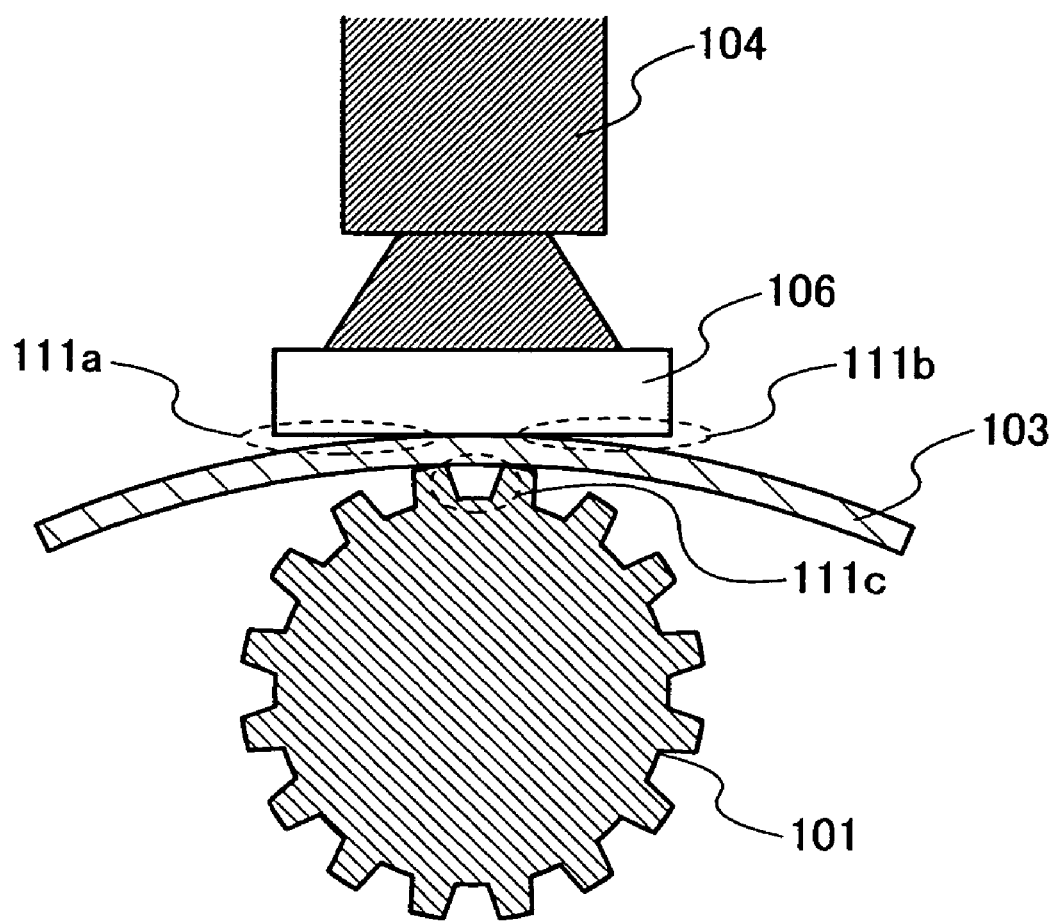
FIG. 3 is a cross-sectional view showing a pickup device of the present invention.

Since the pressing jig 101 surface which presses the film 103 is uneven, a space 111c is formed between the pressing jig 101 and the film 103, as shown in FIG. 3, and an adhesive area between the pressing jig 101 and the film 103 decreases. Therefore, part of the chip 106 can be easily raised up from the film 103.

In addition, in FIG. 3, the chip 106 is partially raised up from the film 103, and spaces 111a and 111b are formed between the chip 106 and the film 103.

Here, a cylinder is used as the pressing jig 101.

Next, sizes of the chip 106 and the pressing jig 101 for pressing up the film 103 will be described with reference to FIGS. 4A and 4B.

Figure 4A:
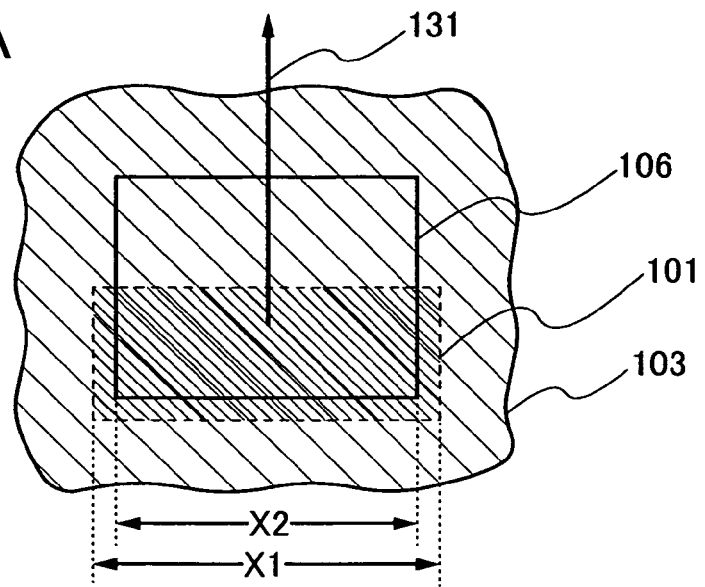
FIGS. 4A and 4B are top views each showing part of a pickup device of the present invention.
Figure 4B:
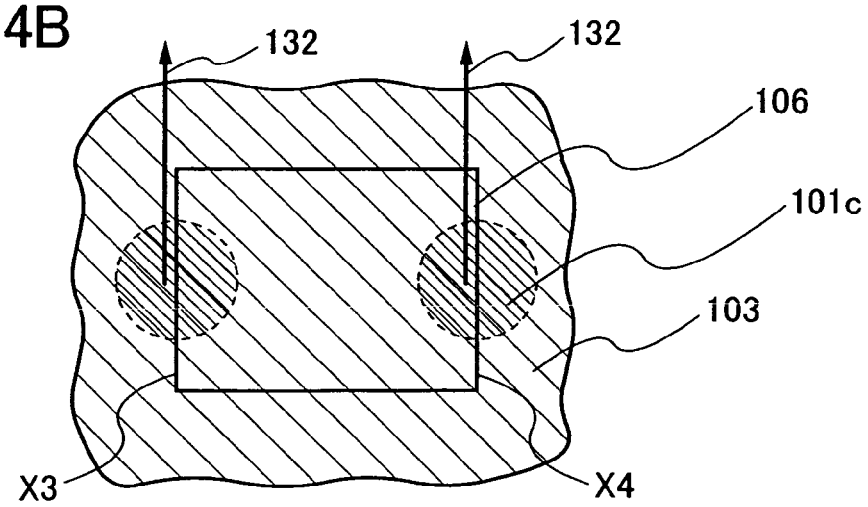

FIGS. 4A and 4B are top views of regions where the pressing jig 101 for pressing up the film 103 and the chip 106 overlap with each other. Here, a rectangular chip is used for the explanation. As shown in FIG. 4A, in a case where the pressing jig 101 for pressing up the film 103 is a cylinder, a polygonal cylinder, or a rectangular solid, a length X1 of a direction (a second direction) which is perpendicular to a rotation direction of the cylinder or the polygonal cylinder, or a moving direction of the rectangular solid (a first direction) 131 is desirably 1 to 10 times a length X2 of the second direction of the chip 106, more preferably 1 to 1.5 times, and even more preferably 1 to 1.2 times. By pressing up the film 103 and the chip 106 provided thereover by using the pressing jig 101 with such a length, at least two sides of the chip 106 can be raised up from the film 103.

Alternatively, in a case where the pressing jig 101 for pressing up the film 103 is the sphere 101c as shown in FIG. 4B, it is preferable that the sphere 101c move while rotating in regions overlapping with two sides X3 and X4 of the chip 106 which are parallel to a moving direction 132 of the sphere 101c. As a result, two sides of the chip 106 which are overlapping with the sphere 101c can be raised up.

In the above-described process, the at least two sides of the chip 106 may be two sides facing to each other, or two sides adjacent to each other. Furthermore, when half or more of each of the two sides is raised up, the chip 106 can be easily picked up by the holding portion later.

Figure 5A:
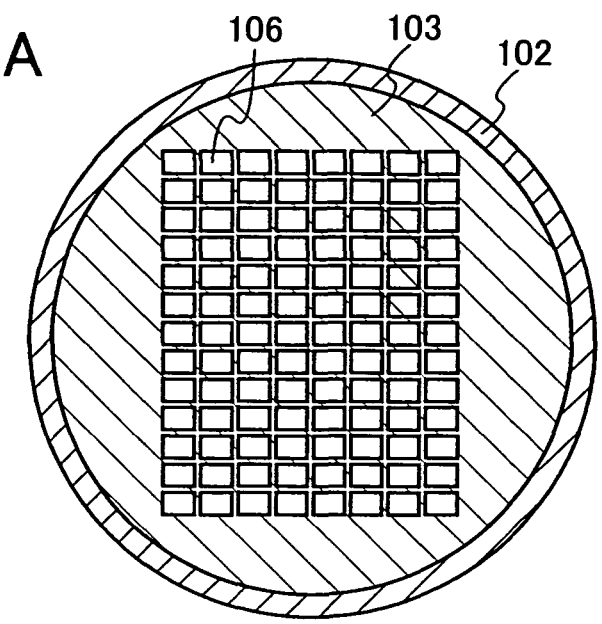
FIGS. 5A to 5D are views each showing part of a pickup device of the present invention.

Next, the film 103 and the frame 102 to which the film 103 is fixed will be described with reference to FIG. 5A. FIG. 5A is a top view of the frame 102 to which the film 103 is fixed. As the film 103, a film having an adhesive layer on one side (an adhesive film) can be used, and typically, an ultraviolet curable adhesive film (also referred to as a UV film, a UV tape, or a UV sheet), a pressure-sensitive sheet of which the adhesiveness is changed by applying pressure, or the like can be given. In addition, without limited to the adhesive film, an adhesive tape, an adhesive sheet, a wafer sheet or the like can also be used.

It is to be noted that a film having no adhesive layer may be used instead of the adhesive film. In this case, the chip is attached to the film by electrostatic force or adsorption power.

Here, an adhesive film, more specifically a pressure-sensitive film, is used as the film 103.

The frame 102 for fixing the film 103 is formed of two circular frames 102a, 102b in this embodiment mode, and the film 103 is sandwiched between the two frames 102a, 102b without bending, so as to be fixed. An expanded ring may be used as the frame 102 for fixing the film 103.

It is to be noted that, although a rectangle is shown as a shape of the chip 106 provided over the film 103 in FIG. 5A, the shape of the chip 106 is not limited to the rectangle, and may be a circle, or a polygon.

In this embodiment mode, a flexible substrate over which a thin film integrated circuit is formed is used as the chip 106.

As the holding jig 104, a suction nozzle, a collet, a gripper such as a pair of tweezers or a pawl, or the like can be used. The suction nozzle is used as the holding jig 104, here.

Figure 5B:
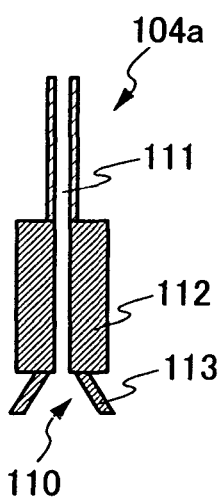
Figure 5C:
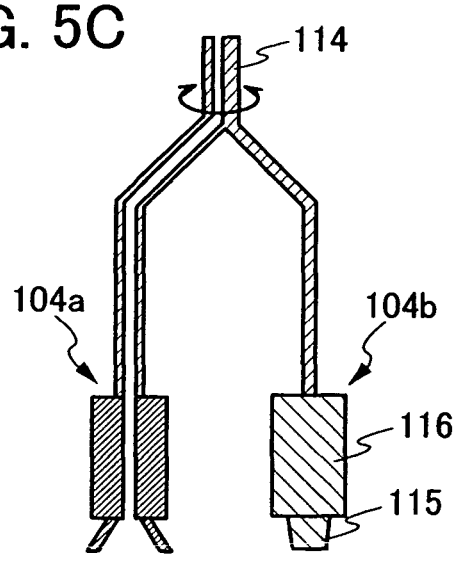
Figure 5D:
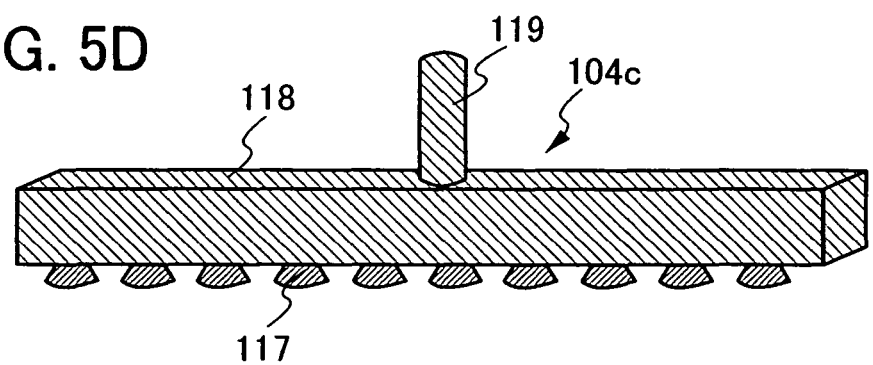

The suction nozzle as a typical example of the holding jig 104 will be described with reference to FIGS. 5B to 5D. FIGS. 5B and 5C are cross-sectional views of the nozzle, and FIG. 5D is a perspective view of the nozzle. As shown in FIG. 5B, the nozzle 104a includes an aspiration port 110 provided for a base portion 112 and an air flow path 111 formed inside the base portion 112. In addition, the nozzle 104a is connected to a decompression device so that an end face of the aspiration port 110 can adsorb the chip 106. When an area of the aspiration port 110 is smaller than that of the chip 106, the chip can be adsorbed with a high yield. In addition, the base portion 112 of the nozzle 104a may be provided with an elastic body 113 typified by rubber. By providing the elastic body 113, a shock of when the nozzle 104a hits the chip 106, or air leak in adsorbing can be reduced. Furthermore, by forming the elastic body 113 into a funnel-like shape in which a diameter of the base portion 112 side is smaller than that of the chip 106 side, chip can be adsorbed more easily.

Furthermore, by providing a heater for the nozzle 104a, the nozzle 104a can have a heating function in addition to a holding function. By providing the heater for the nozzle 104a, the chip 106 can be mounted on a printed-circuit board by thermo compression bonding using the heated heater provided for the nozzle 104a, after the chip 106 provided over the adhesive film 103 is picked up by adsorbing it by the nozzle 104a and moved to the printed-circuit board. In this case, a heat-resistant elastic body which can resist a heating temperature of the thermo compression bonding process may be provided for a tip of the base portion 112 of the nozzle 104a.

Alternatively, a nozzle 104a for suction and a nozzle 104b having a heater may be provided independently, as shown in FIG. 5C. In this case, it is preferable that an axis 114 having the nozzle 104a and the nozzle 104b rotate. When a plurality of nozzles are provided, the chip 106 provided over the adhesive film 103 can be adsorbed by the suction nozzle 104a and held so as to be moved to the printed-circuit board, then the axis 114 is rotated so that the chip can be mounted on the printed-circuit board by thermo compression bonding using a heated heater 115 of the nozzle 104b having a heater.

Alternatively, a nozzle with aspiration ports lined in one direction may be used, as shown in FIG. 5D. In FIG. 5D, a nozzle 104c for suction includes the following: a base portion 118 of the nozzle; a support 119 for supporting the base portion 118; and an elastic body 117 provided for a tip of the aspiration port. In addition, a nozzle with aspiration ports lined in two directions (X and Y directions) may be used. By using such a nozzle having a plurality of aspiration ports, a plurality of chips can be picked up, and throughput can be enhanced.

The holding jig 104 is connected to a robot arm, and the robot arm is further connected to a moving unit, so that lifting, lowering, and horizontal movements (in X, Y, and Z directions) can be freely performed. Furthermore, by providing a rotational apparatus such as a motor for an axis of the nozzle, even a direction of the chip (θ direction) can be rotated, which makes alignment in a case where the chip is mounted on the printed-circuit board easier.

Figure 9:
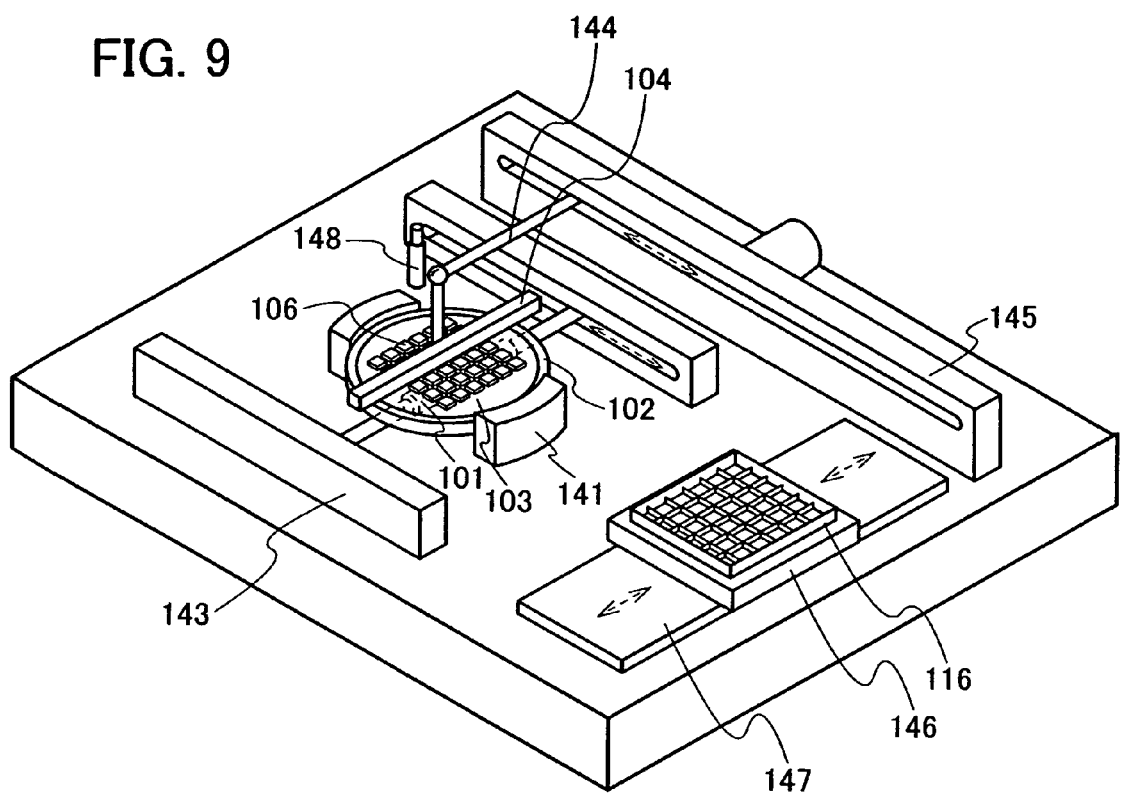
FIG. 9 is a perspective view showing a pickup device of the present invention.

Next, a structure example of a pickup device of the present invention will be described with reference to FIG. 9. FIG. 9 is a perspective view of a pickup device. The pickup device includes the following: the frame 102 for fixing the film 103; the support 141 for supporting the frame 102; the pressing jig 101 for pressing up the film 103, provided under the film 103; the moving unit 143 for moving the pressing jig 101; the holding jig 104 for holding the chip 106 attached to the film 103; the robot arm 144 for moving the holding jig 104; the moving unit 145 for moving the robot arm 144; a table 146 for supporting the tray 116; and a moving unit 147 for moving the table 146. The frame 102 for fixing the film 103 is detachable. The holding jig 104 is connected to a decompression device which is not shown in the figure. In addition, a camera 148 which can perform inspection and location recognition of the chip is 106 also provided. The moving unit 143 for moving the pressing jig 101 is preferably a rotational apparatus which automatically rotates the pressing jig 101, or a moving unit which automatically moves the pressing jig 101. The moving unit 145 for moving the robot arm 144 is preferably a moving unit which automatically moves the robot arm 144.

In this embodiment mode, an example in which the pressing jig 101 for pressing up the film 103 presses upward so as to raise at least two sides of the chip 106 from the film 103, and the chip 106 is adsorbed and picked up by the holding jig 104 is described, but the invention is not limited thereto. The pressing jig 101 may be provided above the film 103 and the holding jig 104 may be provided under the film 103, so that the pressing jig 101 presses the film 103 downward and the chip 106 is picked up.

Furthermore, although an example in which the support 141 of the frame 102 for fixing the film 103 is fixed to the pickup device is described, a support provided for an XY stage may be used instead. By using such a support, the frame 102 can be moved in X and Y directions.

Embodiment Mode 2

In this embodiment mode, a method for picking up a chip using a pickup device of the present invention will be described.

As shown in FIG. 1A, while the pressing jig 101 is pushed to part of the film 103, either the frame 102 holding the film 103, the pressing jig 101 pressing up the film 103, or both are moved relative to one another. At this time, either the film 103, the pressing jig 101, or both are moved relative to one another in the horizontal direction.

As a result, as shown in FIG. 1B, at least two sides a and b of the chip 106 provided over a surface of the film 103 are raised from the film 103, and spaces 111a and 111b are formed between the film 103 and the chip 106; therefore, the adhesive area is reduced. At this time, the film 103 pressed by the pressing jig 101 is bent.

As shown in FIG. 1C, simultaneously with or after raising at least two sides of the chip 106, the chip 106 is held (is aspirated, here) by the holding jig 104, and a surface of the chip 106 is adsorbed by the aspiration port 110 so that the chip 106 is separated from the film 103. Accordingly, the chip 106 can be picked up without being damaged when the chip 106 is separated from the film 103.

Next, a method for moving the pressing jig 101, the frame 102 holding the film 103, and the holding jig 104 relative to one another will be described with reference to FIGS. 6A to 6C. Here, the description will be made on a case of using a rotation body as the pressing jig 101.

Figure 6A:
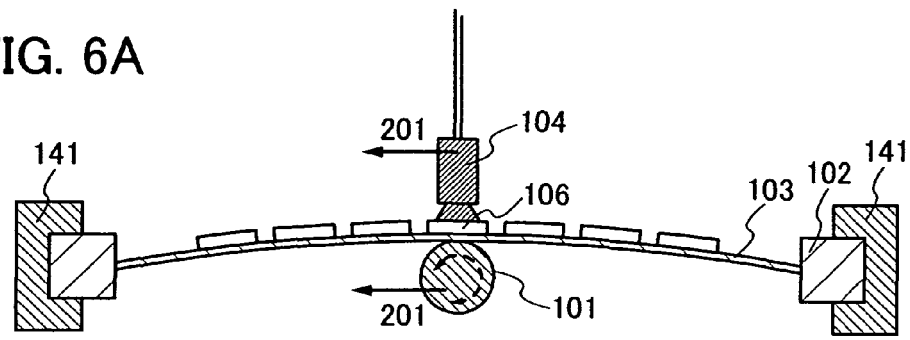
FIGS. 6A to 6C are views each showing part of a pickup device of the present invention.

As shown in FIG. 6A, the frame 102 for holding the film is fixed, and while rotating the pressing jig 101, the pressing jig 101 and the holding jig 104 each are moved in a first direction 201. It is to be noted that the pressing jig 101 may be moved without being rotated. At this time, the pressing jig 101 is moved so that part thereof presses the film 103. As a result, part of the chip 106 is separated from the film 103. Simultaneously with or after raising at least two sides of the chip 106, the chip 106 can be separated using the holding jig 104 and picked up. It is to be noted that the first direction 201 is parallel to a surface of the chip 106 attached to the film 103.

Figure 6B:
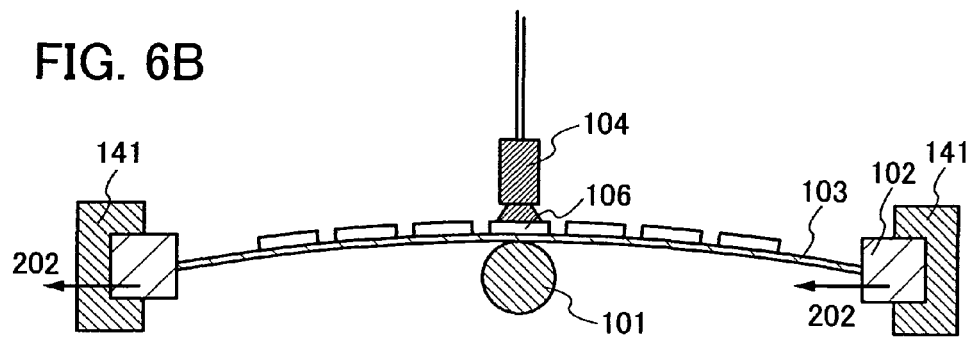

Alternatively, as shown in FIG. 6B, the pressing jig 101 and the holding jig 104 are fixed in locations opposed to each other, and the frame 102 for fixing the film 103 is moved in a first direction 202 so as to raise the chip 106. Simultaneously with or after raising at least two sides of the chip 106, the chip 106 may be separated using the holding jig 104 and picked up. At this time, the pressing jig 101 is moved so as to press part thereof to the film 103. It is to be noted that the first direction 202 is parallel to a surface of the chip 106 attached to the film 103.

Figure 6C:
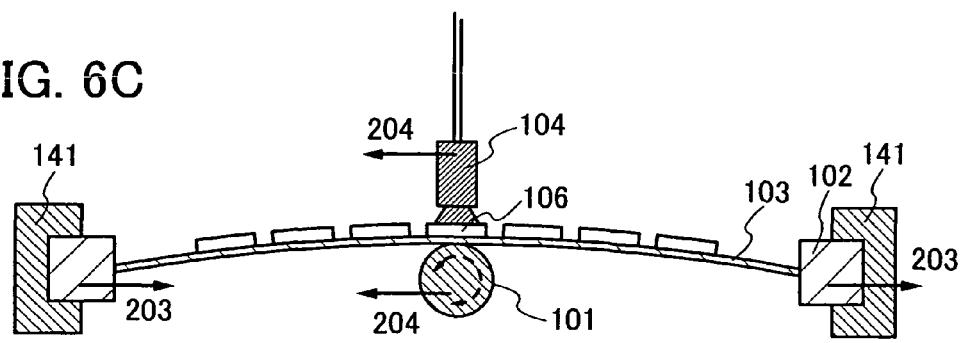

Further alternatively, as shown in FIG. 6C, the frame 102 for holding the film 103 may be moved in a first direction 203 and the pressing jig 101 and the holding jig 104 may be moved in a second direction 204 which is opposite to the first direction, so that the raised chip 106 is separated by using holding jig 104 and picked up. At this time, the pressing jig 101 is moved so as to press part thereof to the film 103. It is to be noted that the first direction 203 and the second direction 204 are parallel to a surface of the chip 106 attached to the film 103.

Next, a method for collecting chips 106 over the film 103 onto the tray will be described with reference to FIGS. 7A and 7B.

As shown in FIG. 7A, the chip 106 over the film 103 is pressed up by using the pressing jig 101 by the above-described method. Simultaneously with or after raising at least two sides of the chip 106, the chip 106 is separated from the film 103 by the holding jig 104. Next, the holding jig 104 is moved by the moving unit to above the tray 116, and the chip 106 is moved to the inside of the tray 116, as shown in FIG. 7B. Through the above-described process, the chip 106 over an adhesive tape can be collected onto the tray 116 easily.

Next, a method in which the chip 106 over the film 103 is mounted on the printed-circuit board 125 will be described with reference to FIGS. 8A to 8C.

Figures 8A, 8B, 8C:
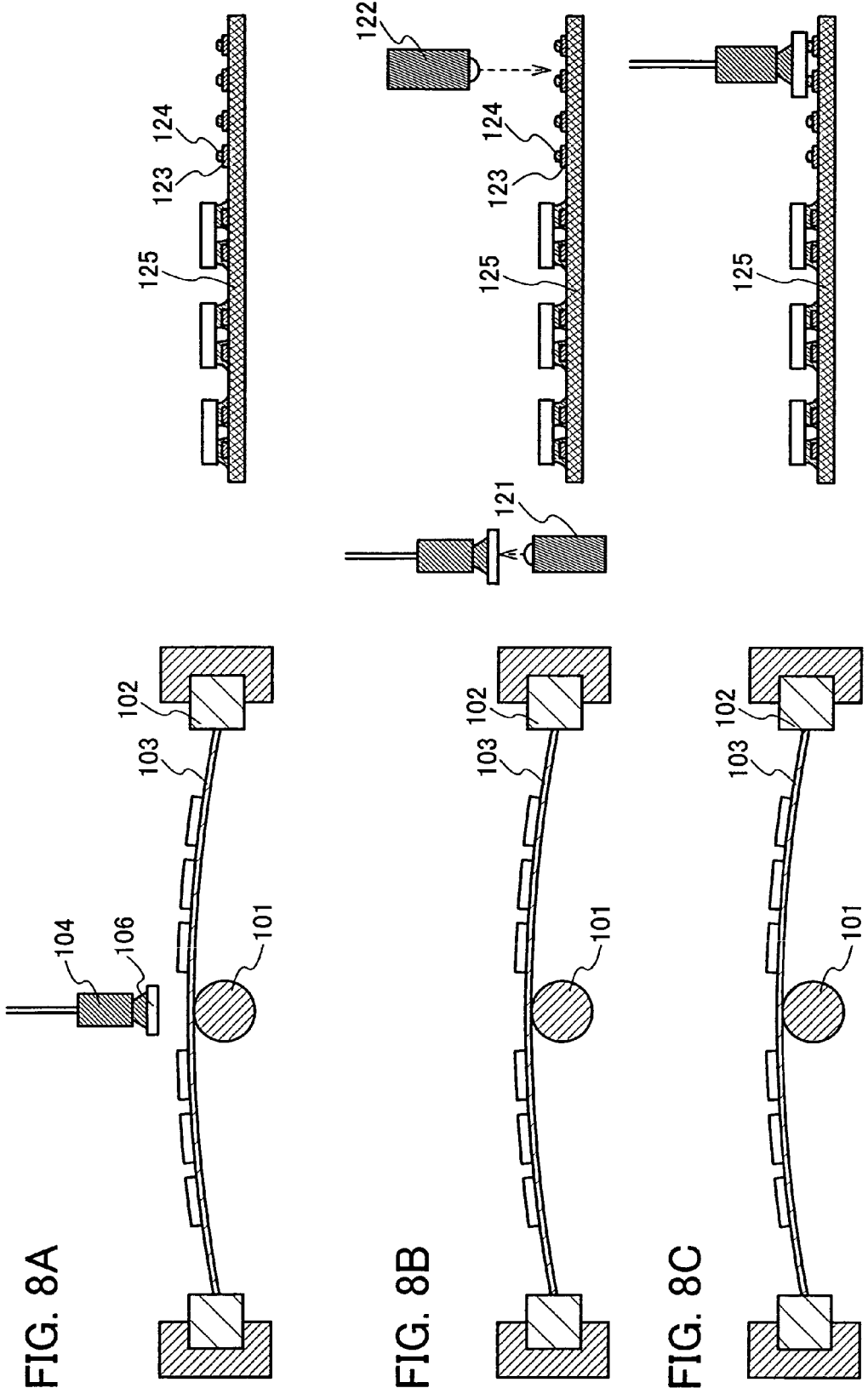
FIGS. 8A to 8C are views each showing a pickup method of the present invention.

As shown in FIG. 8A, the chip 106 over the film 103 is pressed up by using the pressing jig 101 by the above-described method. Simultaneously with or after raising at least two sides of the chip 106, the chip 106 is separated from the film 103 by the holding jig 104.

Next, as shown in FIG. 8B, a location of the connecting terminal formed on the chip is recognized and positioned by a camera 121, and at the same time, a location of a connecting terminal 123 formed on the printed-circuit board 125 is recognized by a camera 122. It is to be noted that a conductive paste 124 is provided for a surface of the connecting terminal 123 formed over the printed-circuit board 125.

Next, as shown in FIG. 8C, while positioning the chip 106 so that the connecting terminal of the chip 106 and the connecting terminal 123 of the printed-circuit board 125 are connected to each other, the chip 106 is moved to above the conductive paste 124 of the connecting terminal 123. Next, the chip 106 is heated while applying pressure, so that the chip 106 is attached to the connecting terminal 123 by thermo compression bonding.

Through the above-described process, the chip 106 over the film 103 can be mounted on the printed-circuit board 125 easily.

This application is based on Japanese Patent Application serial No. 2005-284550 filed in Japan Patent Office on Sep. 29, 2005, the contents of which are hereby incorporated by reference.

What is claimed is:

1. A pickup device comprising:
   a frame fixing a film to which a chip is attached;
   a support holding the frame;
   a pressing jig pressing a surface of the film, to which the chip is not attached;
   a holding jig holding the chip attached to a portion of the film being pressed, or to a portion of the film having been pressed by the pressing jig; and
   a moving unit moving the holding jig, and
   wherein either the frame, the pressing jig, or both are moved relative to one another in a direction parallel to a surface of the film to which the chip is attached
   wherein the pressing jig is configured to separate at least two sides of the chip which are perpendicular to the moving direction from the film while either the frame, the pressing jig, or both are moved relative,
   wherein the frame is formed of two circular frames, and
   wherein the frame is provided between the support.

2. The pickup device according to claim 1, wherein the film is bent by pressing the film with the pressing jig.

3. The pickup device according to claim 1, further comprising a moving unit for moving the film and/or the pressing jig relative to one another,
   wherein the moving unit is connected to at least one of the support and the pressing jig.

4. The pickup device according to claim 1, wherein the pressing jig is a rotation body, and the film is pressed with a rotation surface of the rotation body.

5. The pickup device according to claim 4, wherein the rotation body is a cylinder, a polygonal cylinder, or a sphere.

6. The pickup device according to claim 1, wherein the pressing jig is a rectangular solid, and an edge or a surface of the rectangular solid presses the film.

7. The pickup device according to claim 1, wherein a surface of the pressing jig is uneven.

8. The pickup device according to claim 1, wherein a surface of the pressing jig has a projection portion.

9. The pickup device according to claim 1, wherein the holding jig is a suction nozzle, a collet, or a gripper.

10. The pickup device according to claim 9, wherein the suction nozzle is connected to decompression means.

11. The pickup device according to claim 9, wherein a tip of the suction nozzle is formed of an elastic body.

12. The pickup device according to claim 1, wherein the pickup device includes an image recognition unit.

13. A pickup method comprising steps of:
   moving either a film to which a chip is attached and which is held by a frame, a pressing jig, or both relative to one another in a horizontal direction;
   pressing the film with the pressing jig; and
   picking up the chip from the film, wherein the pressing jig is configured to separate at least two sides of the chip which are perpendicular to the moving direction from the film while either the frame, the pressing jig, or both are moved relative, wherein the frame is formed of two circular frames, and wherein the frame is provided between a support.

14. The pickup method according to claim 13, further comprising steps of:

bending the film by pressing the film with the pressing jig;

forming spaces between the chip and the film; and picking up the chip from the film.

15. The pickup method according to claim 13, wherein the horizontal direction is a direction parallel to a surface of the film to which the chip is attached.

16. The pickup method according to claim 13, wherein the pressing jig is a rotation body, and a rotational surface of the rotation body is pressed against the film.

17. The pickup method according to claim 13, wherein the pressing jig is a rectangular solid, and an edge of the rectangular solid is pressed against the film.

18. A pickup method comprising steps of:

moving either a film to which a chip is attached and which is held by a frame, a pressing jig, or both relative to one another in a horizontal direction, while the pressing jig is rotated;

pressing the film with the pressing jig; and picking up the chip from the film, wherein the pressing jig is configured to separate at least two sides of the chip which are perpendicular to the moving direction from the film while either the frame, the pressing jig, or both are moved relative, wherein the frame is formed of two circular frames, and wherein the frame is provided between a support.

19. The pickup method according to claim 18, further comprising steps of:

bending the film by pressing the film with the pressing jig;

forming spaces between the chip and the film; and picking up the chip from the film.

20. The pickup method according to claim 18, wherein the horizontal direction is a direction parallel to a surface of the film to which the chip is attached.

21. The pickup method according to claim 18, wherein the pressing jig is a rotation body, and a rotational surface of the rotation body is pressed against the film.

22. The pickup method according to claim 18, wherein the pressing jig is a rectangular solid, and an edge of the rectangular solid is pressed against the film.

23. A pickup device comprising:

a frame for fixing a film wherein the film has a front surface and a back surface and a chip is provided on the front surface of the film;

a pressing jig;

a first mechanism which allows the pressing jig to press a portion of the film from the back surface of the film;

a second mechanism which changes a location of the portion of the film simultaneously as the pressing jig presses the portion of the film; and a holding jig for holding the chip, wherein the pressing jig is configured to separate at least two sides of the chip which are perpendicular to a direction from the film while either the frame, the pressing jig, or both are moved relative, wherein the frame is formed of two circular frames, and wherein the frame is provided between a support.

24. The pickup device according to claim 23, wherein the holding jig is selected from the group consisting of a suction nozzle, a collet and a gripper.

25. The pickup device according to claim 23, wherein the pressing jig is selected from the group consisting of a cylinder, a polygonal cylinder and a sphere.

26. The pickup device according to claim 23, wherein the pressing jig is a rectangular solid.

27. A pickup method comprising:

providing a film having a front surface and a back surface wherein a chip is provided on the front surface of the film, and the film is held by a frame;

pressing a portion of the film from the back surface of the film with a pressing jig so that the film is bent wherein the portion of the film is overlapped with the chip;

changing a location of the portion of the film at the same time as pressing the portion of the film; and picking up the chip with a holding jig, wherein the pressing jig is configured to separate at least two sides of the chip which are perpendicular to a direction from the film while either the frame, the pressing jig, or both are moved relative, wherein the frame is formed of two circular frames, and wherein the frame is provided between a support.

28. The pickup method according to claim 27, wherein the holding jig is selected from the group consisting of a suction nozzle, a collet and a gripper.

29. The pickup method according to claim 27, wherein the pressing jig is selected from the group consisting of a cylinder, a polygonal cylinder and a sphere.

30. The pickup method according to claim 27, wherein the pressing jig is a rectangular solid.

31. The pickup device according to claim 1, wherein the film is sandwiched between the two circular frames.

32. The pickup method according to claim 13, wherein the film is sandwiched between the two circular frames.

33. The pickup method according to claim 18, wherein the film is sandwiched between the two circular frames.

34. The pickup device according to claim 23, wherein the film is sandwiched between the two circular frames.

35. The pickup method according to claim 27, wherein the film is sandwiched between the two circular frames.

* * * * *